United States Patent
Ptacek et al.

(10) Patent No.: US 12,494,787 B2
(45) Date of Patent: Dec. 9, 2025

(54) ADAPTIVE PULSE CONTROL FOR HIGH-VOLTAGE LEVEL SHIFTERS

(71) Applicant: SEMICONDUCTOR COMPONENTS INDUSTRIES, LLC, Scottsdale, AZ (US)

(72) Inventors: Karel Ptacek, Roznov pod Radhostem (CZ); Jaroslav Knop, Radslavice (CZ)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 328 days.

(21) Appl. No.: 18/462,240

(22) Filed: Sep. 6, 2023

(65) Prior Publication Data

US 2025/0080116 A1 Mar. 6, 2025

(51) Int. Cl.
  *H02M 1/08* (2006.01)
  *H02M 3/158* (2006.01)
  *H03K 17/081* (2006.01)
  *H03K 19/0185* (2006.01)

(52) U.S. Cl.
  CPC ...... *H03K 19/018507* (2013.01); *H02M 1/08* (2013.01); *H02M 3/158* (2013.01); *H03K 17/08104* (2013.01)

(58) Field of Classification Search
  CPC ..... H03K 19/018507; H03K 17/08104; H03K 3/0233; H03K 5/26; H03K 7/08; H03K 19/082; H02M 1/08; H02M 3/158; H02M 1/123; H02M 3/156; H02M 1/0006
  See application file for complete search history.

(56) References Cited

U.S. PATENT DOCUMENTS

| | | | | |
|---|---|---|---|---|
| 7,564,704 | B2 * | 7/2009 | Rozsypal | H02M 3/3376 363/97 |
| 7,688,052 | B2 * | 3/2010 | Rozsypal | H02M 3/07 323/284 |
| 8,044,699 | B1 | 10/2011 | Kelly | |
| 8,633,745 | B1 | 1/2014 | Peterson | |
| 12,191,847 | B2 * | 1/2025 | Ptacek | H02M 3/33523 |
| 2006/0186922 | A1 | 8/2006 | Rozsypal | |
| 2010/0315150 | A1 | 12/2010 | Ochi | |
| 2012/0081149 | A1 | 4/2012 | Akahane | |
| 2014/0210541 | A1 | 7/2014 | Yao et al. | |
| 2019/0158093 | A1 | 5/2019 | Zhu et al. | |

* cited by examiner

*Primary Examiner* — Kyle J Moody
(74) *Attorney, Agent, or Firm* — Dickinson Wright PLLC; Jonathan A. Schnayer (57) ABSTRACT

Signal converters, systems for power conversion, and methods for adaptive pulse control. The signal converter includes a pulse generator, a level shifter, and a controller. The pulse generator is configured to receive an input control signal for a switch driver. The pulse generator is also configured to generate a set control signal based on the input control signal. The level shifter is configured to generate, based on the set control signal, an output control signal having a first amplitude greater than a second amplitude of the input control signal. The level shifter is also configured to send the output control signal to the switch driver. The controller is configured to detect a common mode transient at a node coupled to the switch driver. The pulse generator is further configured to increase a pulse width of the set control signal when the controller detects the common mode transient.

20 Claims, 11 Drawing Sheets

ADAPTIVE PULSE CONTROL FOR HIGH-VOLTAGE LEVEL SHIFTERS

BACKGROUND

Level shifters are widely used in high-voltage, half-bridge applications to level shift a high-side control signal between a low-voltage power domain and a high-voltage power domain. Since such applications may operate at frequencies in the range of tens to thousands of kilohertz and the control signals may be level shifted up to hundreds of volts, it is desirable to minimize propagation delay and power loss.

SUMMARY

Set and reset pulses can be used to control a level shifter to generate a high-voltage control signal from a low-voltage control signal. Wide set and reset pulses increase transmission reliability during common mode transients but also increase power loss. Narrow set and reset pulses minimize power loss but also limit transmission reliability during common mode transients. The present disclosure provides signal converters, systems for power conversion, and methods for adaptive pulse control that, among other things, widen control pulses for a level shifter during common mode transients.

The present disclosure provides a signal converter including, in one implementation, a pulse generator, a level shifter, and a controller. The pulse generator is configured to receive an input control signal for a switch driver. The pulse generator is also configured to generate a set control signal based on the input control signal. The level shifter is configured to generate, based on the set control signal, an output control signal having a first amplitude greater than a second amplitude of the input control signal. The level shifter is also configured to send the output control signal to the switch driver. The controller is configured to detect a common mode transient at a node coupled to the switch driver. The pulse generator is further configured to increase a pulse width of the set control signal when the controller detects the common mode transient.

The present disclose also provides a system for power conversion including, in one implementation, a power converter, a driver, and a signal converter. The power converter includes a transistor. The driver is configured to control the transistor. The signal converter is configured to receive an input control signal for the driver. The signal converter is also configured to generate a set control signal based on the input control signal. The signal converter is further configured to generate, based on the set control signal, an output control signal having a first voltage level greater than a second voltage level of the input control signal. The signal converter is also configured to send the output control signal to the driver. The signal converter is further configured to detect a common mode transient at a node coupled to the driver. The signal converter is also configured to increase a pulse width of the set control signal responsive to detecting the common mode transient.

The present disclosure further provides a method for adaptive pulse control. The method includes receiving an input control signal for a transistor driver. The method also includes generating a set control signal based on the input control signal. The method further includes generating, based on the set control signal, an output control signal having a first amplitude greater than a second amplitude of the input control signal. The method also includes sending the output control signal to the transistor driver. The method further includes detecting a common mode transient at a node coupled to the transistor driver. The method also includes increasing a pulse width of the set control signal responsive to detecting the common mode transient.

BRIEF DESCRIPTION OF THE DRAWINGS

For a detailed description of example implementations, reference will now be made to the accompanying drawings in which.

DEFINITIONS

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

In relation to electrical devices, whether stand alone or as part of an integrated circuit, the terms "input" and "output" refer to electrical connections to the electrical devices, and shall not be read as verbs requiring action. For example, a differential amplifier, such as an operational amplifier, may have a first differential input and a second differential input, and these "inputs" define electrical connections to the operational amplifier, and shall not be read to require inputting signals to the operational amplifier.

"Controller" shall mean, alone or in combination, individual circuit components, an application specific integrated circuit (ASIC), one or more microcontrollers with controlling software, a reduced-instruction-set computer (RISC) with controlling software, a digital signal processor (DSP), one or more processors with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various implementations of the invention. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the present disclosure, including the claims, is limited to that implementation.

Various examples are directed to systems and methods of adaptive pulse control for high-voltage level shifters. More particularly, various examples are directed to systems for power conversion and related signal converters that increase pulse widths of set and reset control signals during common mode transients. The specification now turns to an example system to orient the reader.

Figure 1A:
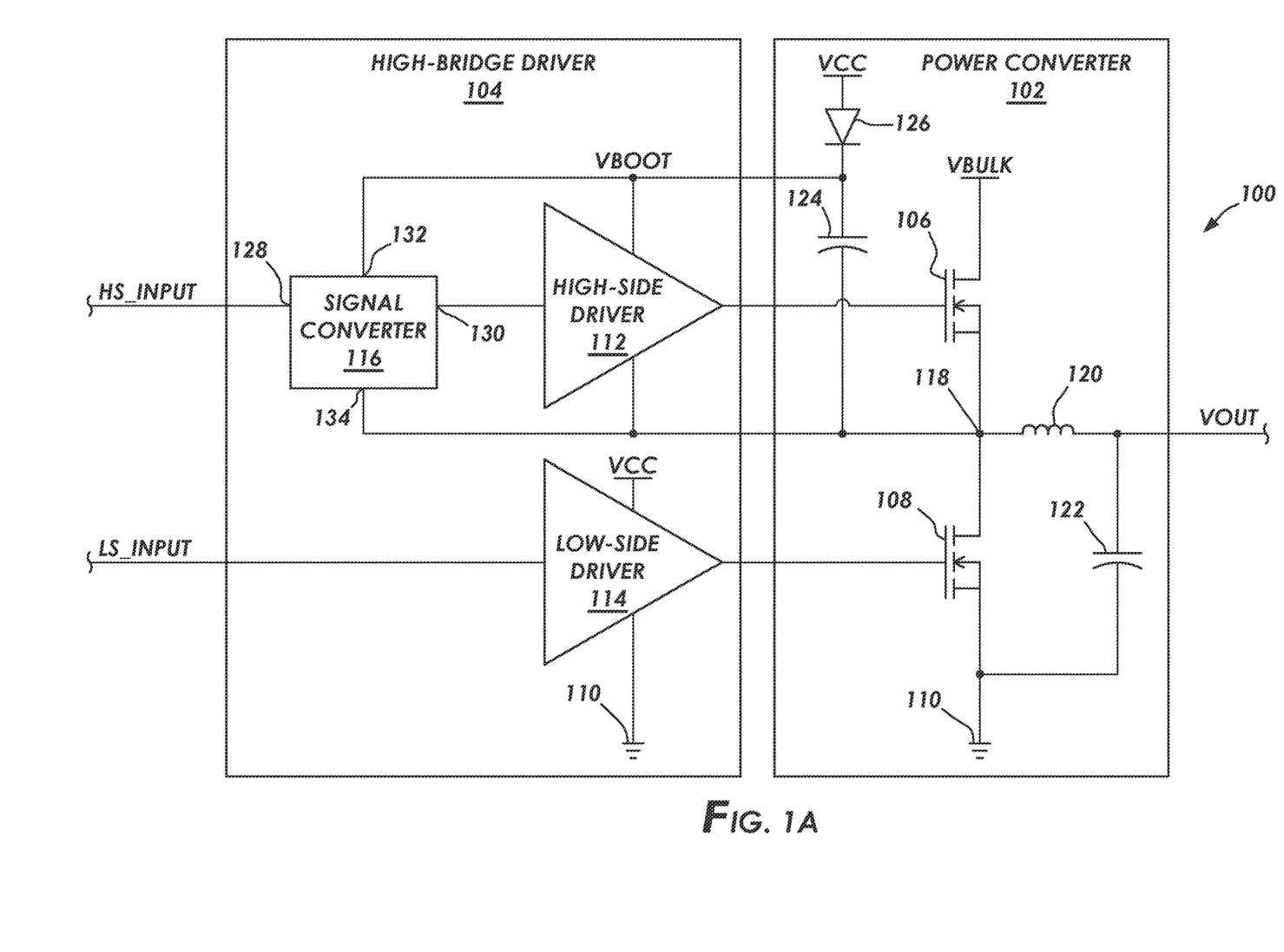
FIG. 1A is a partial schematic and a partial block diagram of an example of a system for power conversion including a half-bridge driver in accordance with some implementations.

FIG. 1A is a partial schematic and a partial block diagram of an example of a system 100 for power conversion in accordance with some implementations of the present disclosure. The system 100 illustrated in FIG. 1A includes a power converter 102 and a half-bridge driver 104. The methods described herein may be used with systems having more components, fewer components, or different components in different configurations than the system 100 illustrated in FIG. 1A. In some implementations, the power converter 102 and the half-bridge driver 104 are separate components (as illustrated in FIG. 1A). In alternate implementations, the power converter 102 and the half-bridge driver 104 may be part of the same component. For example, the power converter 102 and the half-bridge driver 104 may both be positioned on a single printed circuit board or within a single chip housing.

The power converter 102 illustrated in FIG. 1A includes a high-side transistor 106 and a low-side transistor 108 that are coupled in a series configuration between an input voltage supply VBULK and a reference terminal 110 (for example, a ground terminal). The high-side transistor 106 and the low-side transistor 108 are illustrated in FIG. 1A as metal-oxide-semiconductor field-effect transistors (MOSFETs), and in particular, N-channel MOSFETs. However, other types of FETs may be used (for example, P-channel MOSFETs), and in fact other types of transistors may also be used (for example, bi-polar junction transistors (BJTs) and junction gate field-effect transistor (JFETs). In some implementations, the high-side transistor 106 and the low-side transistor 108 are Gallium nitride (GaN) transistors. In alternate implementations, the high-side transistor 106 and the low-side transistor 108 are Silicon Carbide (SIC) transistors. The half-bridge driver 104 illustrated in FIG. 1A includes a high-side driver 112, a low-side driver 114, and a signal converter 116. The high-side driver 112 (one example of a "switch driver" and a "transistor driver") controls the high-side transistor 106 and the low-side driver 114 controls the low-side transistor 108 to generate a square wave at a bridge node 118 of the power converter 102. The power converter 102 illustrated in FIG. 1A also includes an inductor 120 and a first capacitor 122 that together form a resonant tank to filter the square wave and generate an output signal (for example, output VOUT).

The low-side transistor 108 operates in a low-voltage power domain (for example, less than 10 Volts). Thus, to control the low-side transistor 108, the low-side driver 114 also operates in the low-voltage power domain. For example, the low-side driver 114 illustrated in FIG. 1A is coupled to a low-voltage supply VCC. The high-side transistor 106 operates in a high-voltage power domain (for example, greater than 100 Volts). Thus, to control the high-side transistor 106, the high-side driver 112 also operates in a high-voltage power domain. The power converter 102 illustrated in FIG. 1A also includes a second capacitor 124 for generating a high-voltage supply VBOOT for the high-side driver 112 from the low-voltage supply VCC.

During a first state of the power converter 102 in which the high-side transistor 106 is turned off and the low-side transistor 108 is turned on, electric charge is supplied to the second capacitor 124 from the low-voltage supply VCC through a diode 126. Subsequently, during a second state of the power converter 102 in which the high-side transistor 106 is turned on and the low-side transistor 108 is turned off, the bridge node 118 is shorted to the input voltage supply VBULK by the high-side transistor 106. During the second state of the power converter 102, the electric charge stored in the second capacitor 124 cannot flow to the low-voltage supply VCC because the diode 126 is reversely polarized. Thus, during the second state of the power converter 102, the electric charge stored in the second capacitor 124 is supplied to the high-side driver 112.

The half-bridge driver 104 receives a pair of complementary input control signals (for example, high-side input control signal HS_INPUT and low-side input control signal LS_INPUT as illustrated in FIG. 1A) that control the high-side driver 112 and the low-side driver 114, respectively. The half-bridge driver 104 may receive the pair of complementary input control signals from a separate controller (not shown). The pair of complementary input control signals are low-voltage signals (for example, with amplitudes less than 10 Volts). As described above, the low-side driver 114 operates in the low-voltage power domain. Thus, the low-side input control signal LS_INPUT may directly drive the low-side driver 114 as illustrated in FIG. 1A. However, as also described above, the high-side driver 112 operates in the high-voltage power domain. Thus, the high-side input control signal HS_INPUT (which is a low-voltage signal and is one example of an "input control signal") is unable to directly control the high-side driver 112.

The signal converter 116 is configured to adjust the amplitude of the high-side input control signal HS_INPUT between the low-voltage power domain and the high-voltage power domain in which the high-side driver 112 operates. As will be described in more detail below, the signal converter 116 generates a high-side output control signal (an example of an "output control signal") with an amplitude that is greater than the amplitude of the high-side input control signal HS_INPUT and is sufficient to control the high-side driver 112. As illustrated in FIG. 1A, the signal converter 116 receives the high-side input control signal HS_INPUT at an input terminal 128. Further, as illustrated in FIG. 1A, an output terminal 130 of the signal converter 116 is coupled to the input of the high-side driver 112 to provide the high-side output control signal thereto. The signal converter 116 illustrated in FIG. 1A also includes a power connection 132 coupled to the high-voltage supply VBOOT and a reference connection 134 coupled to the bridge node 118.

Figure 1B:
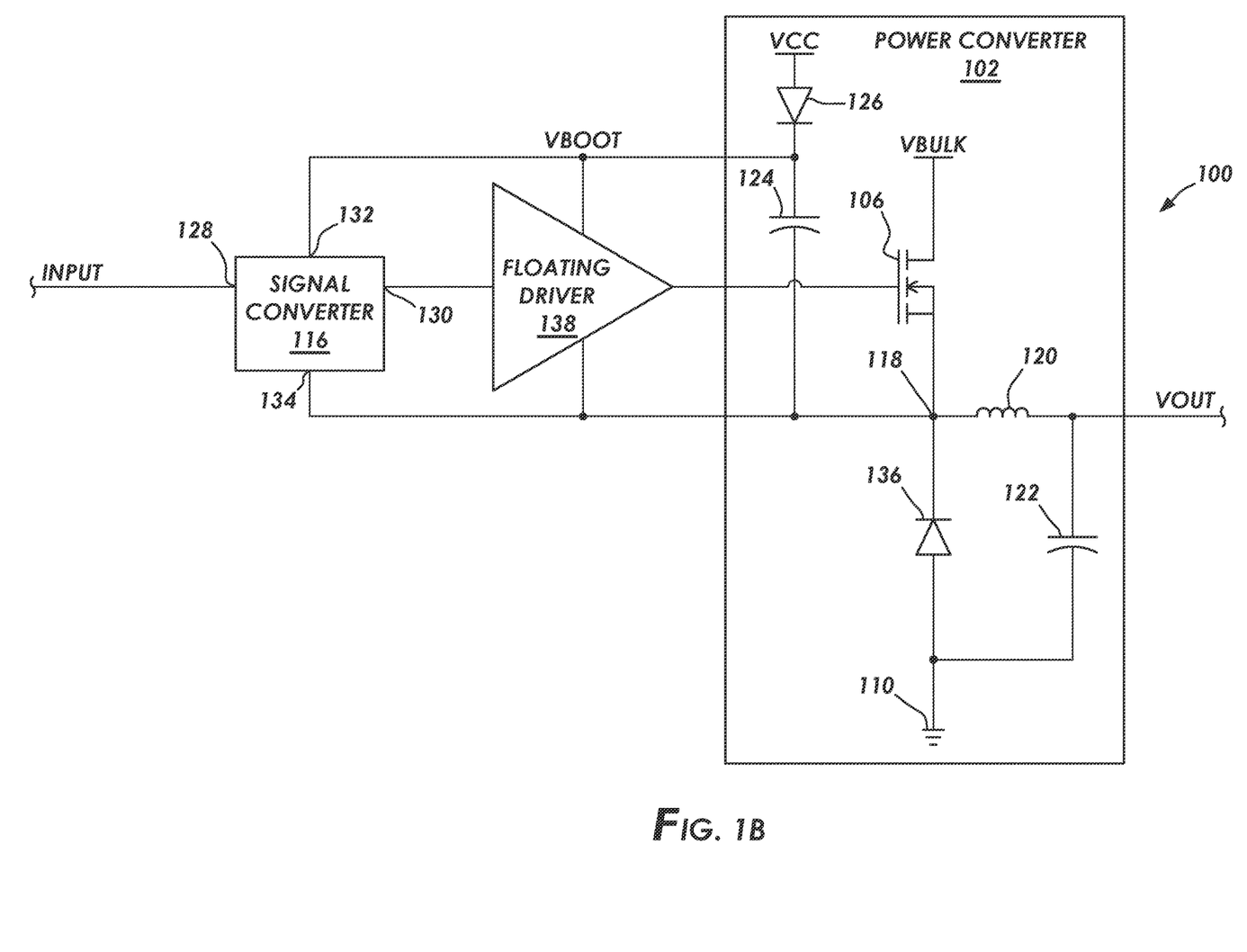
FIG. 1B is a partial schematic and a partial block diagram of an example of a system for power conversion including a floating driver in accordance with some implementations.

In some implementations, the power converter 102 does not include the low-side transistor 108. For example, in FIG. 1B, the low-side transistor 108 is replaced by a diode 136 whose cathode is coupled to the high-side transistor 106, and whose anode is coupled to the reference terminal 110. In such implementations, as illustrated in FIG. 1B, the high-side driver 112 is replaced by a floating driver 138, and the low-side driver 114 is not included. The specification now turns to a description of the components located within the signal converter 116.

Figure 2:
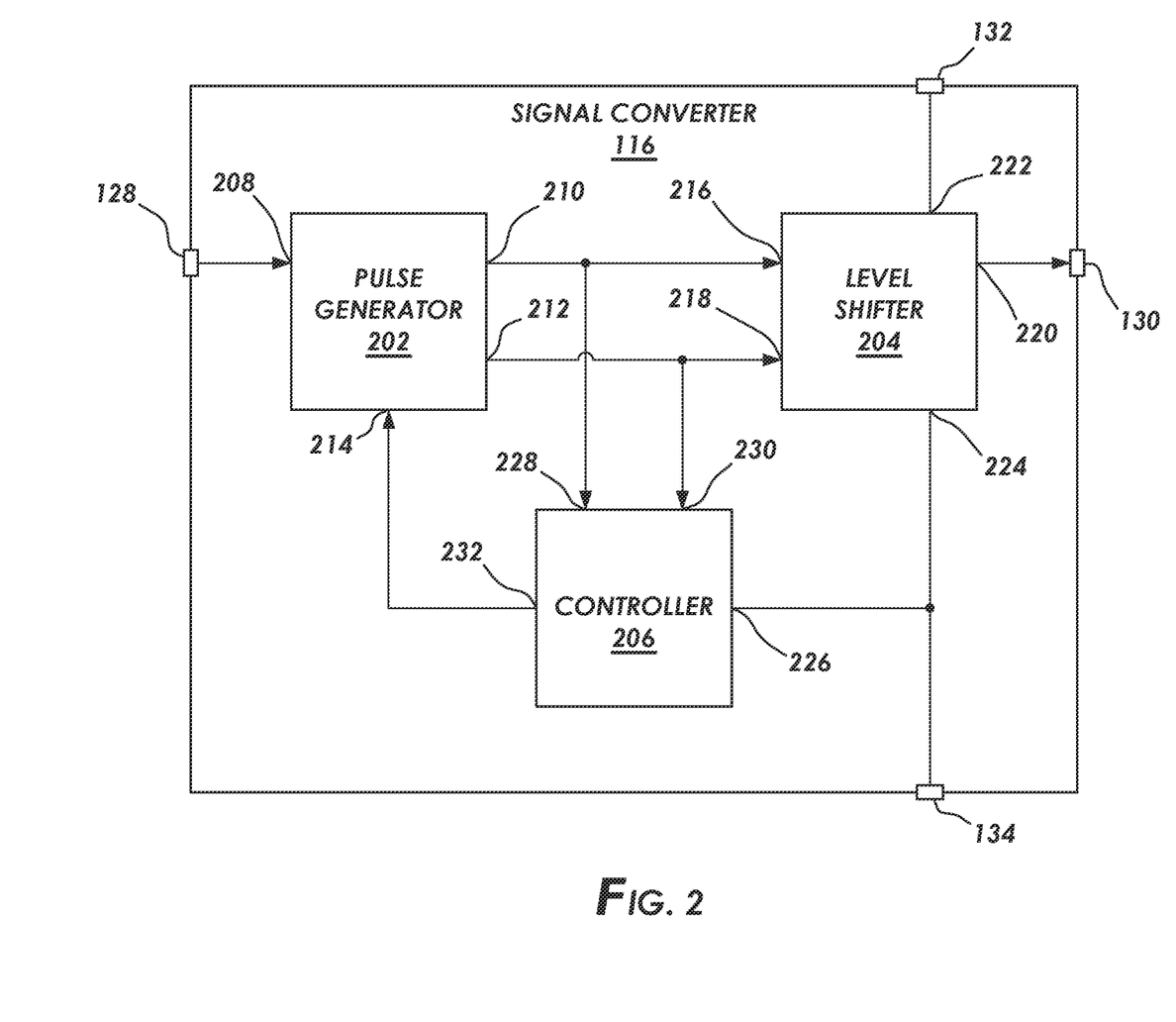
FIG. 2 is a partial schematic and a partial block diagram of an example of a signal converter included in the systems of FIGS. 1A and 1B in accordance with some implementations.

FIG. 2 is a partial schematic and a partial block diagram of an example of the signal converter 116 in accordance with some implementations of the present disclosure. The signal converter 116 illustrated in FIG. 2 includes a pulse generator 202, a level shifter 204, and a controller 206. In some implementations, the signal converter 116 may include more components, fewer components, or different components than the ones illustrated in FIG. 2. For example, aside from the connections described below, additional input and output connections will be present (for example, power connections, reference voltage connections, and ground connections), but those additional input and output connections are not shown so as not to unduly complicate the figure.

The pulse generator 202 is configured to generate set and reset control signals based on the high-side input control signal HS_INPUT. For example, the pulse generator 202 may generate a pulse in the set control signal (one example of a "set pulse") in response to detecting the start of a pulse in the high-side input control signal HS_INPUT (one example of an "input pulse"). Further, the pulse generator 202 may generate a pulse in the reset control signal (one example of a "reset pulse") in response to detecting the end of a pulse in the high-side input control signal HS_INPUT. The pulse generator 202 illustrated in FIG. 2 includes an input terminal 208, a first output terminal 210, a second output terminal 212, and a control terminal 214. The input terminal 208 is coupled to input terminal 128 of the signal converter 116 to receive the high-side input control signal HS_INPUT. The first output terminal 210 is coupled to the level shifter 204 and the controller 206 to provide the set control signal thereto. The second output terminal 212 is coupled to the level shifter 204 and the controller 206 to provide the reset control signal thereto. The control terminal 214 is coupled to the controller 206 to receive detection signals therefrom.

The level shifter 204 is configured to generate a high-side output control signal for the high-side driver 112. The level shifter 204 illustrated in FIG. 2 includes a first input terminal 216, a second input terminal 218, an output terminal 220, a power connection 222, and a reference connection 224. The first input terminal 216 of the level shifter 204 is coupled to the first output terminal 210 of the pulse generator 202 to receive the set control signal therefrom. The second input terminal 218 of the level shifter 204 is coupled to the second output terminal 212 of the pulse generator 202 to receive the reset control signal therefrom. The output terminal 220 of the level shifter 204 is coupled to the output terminal 130 of the signal converter 116 to send the high-side output control signal to the high-side driver 112. As will be described in more detail below, the level shifter 204 is configured to start generating a pulse in the high-side output control signal responsive to the set control signal, and stop generating the pulse in the output control signal responsive to the reset control signal. The power connection 222 of the level shifter 204 is coupled to the high-voltage supply VBOOT via the power connection 132 of the signal converter 116. The reference connection 224 is coupled to the bridge node 118 of the power converter 102 via the reference connection 134 of the signal converter 116.

The controller 206 is configured to detect common mode transients at one or more nodes coupled to the signal converter 116, as will be described below in more detail. The controller 206 illustrated in FIG. 2 includes a sensing terminal 226, a first input terminal 228, a second input terminal 230, and an output terminal 232. The sensing terminal 226 of the controller 206 illustrated in FIG. 2 is coupled to the bridge node 118 of the power converter 102 via the reference connection 134 of the signal converter 116. Alternatively, or in addition, the sensing terminal 226 of the controller 206 may be coupled to one or more other low-impedance nodes. For example, the sensing terminal 226 of the controller 206 may be coupled to the high-voltage supply VBOOT via the power connection 132 of the signal converter 116. The first input terminal 228 of the controller 206 is coupled to the first output terminal 210 of the pulse generator 202 to receive the set control signal therefrom. The second input terminal 230 of the controller 206 is coupled to the second output terminal 212 of the pulse generator 202 to receive the reset control signal therefrom. The output terminal 232 of the controller 206 is coupled to the control terminal 214 of the pulse generator 202 to provide detection signals thereto. As will be described in more detail below, the controller 206 is configured to generate detection signals while detecting common mode transients at one or more nodes coupled to the signal converter 116. The specification now turns to a description of the components located within the level shifter 204.

Figure 3:
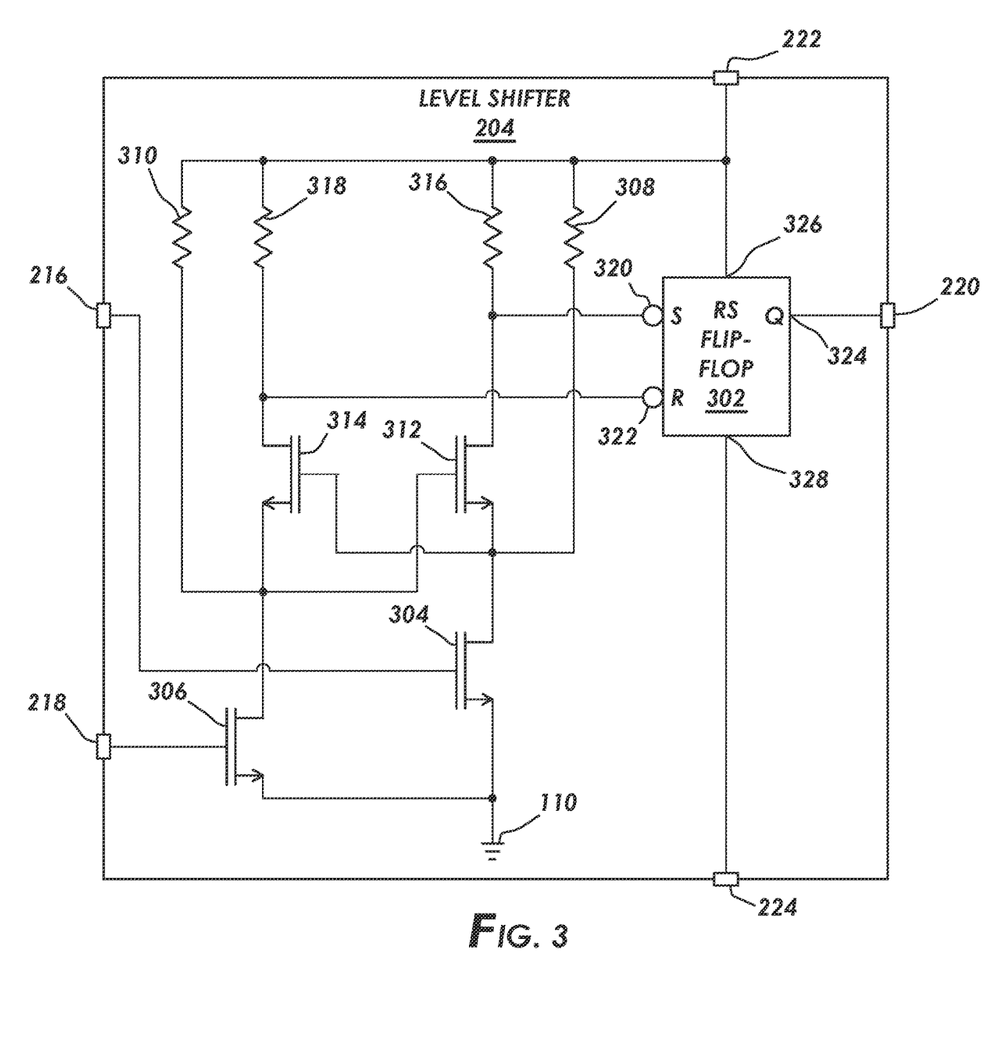
FIG. 3 is a partial schematic and partial block diagram of an example of a level shifter included in the signal converter of FIG. 2 in accordance with some implementations.

FIG. 3 is a partial schematic and partial block diagram of an example of the level shifter 204 in accordance with some implementations of the present disclosure. The level shifter 204 illustrated in FIG. 3 includes an RS flip-flop 302, a first high-voltage transistor 304, a second high-voltage transistor 306, a first sensing resistor 308, a second sensing resistor 310, a first differential transistor 312, a second differential transistor 314, a first load resistor 316, and a second load resistor 318. In some implementations, the level shifter 204 may include more components, fewer components, or different components than the ones illustrated in FIG. 3.

The RS flip-flop 302 is configured to generate the high-side output control signal based on the set and reset control signals. When the set control signal generated by the pulse generator 202 changes from low to high while the reset control signal generated by the pulse generator 202 is kept low, the RS flip-flop 302 is placed in a set state. When placed in the set state, the RS flip-flop 302 changes the high-side output control signal from low to high. Further, when the reset control signal generated by the pulse generator 202 changes from low to high while the set control signal generated by the pulse generator 202 is kept low, the RS flip-flop 302 is placed in a reset state. When placed in the reset state, the RS flip-flop 302 changes the high-side output control signal from low to high. The RS flip-flop 302 illustrated in FIG. 3 includes a first input terminal 320, a second input terminal 322, an output terminal 324, a power connection 326, and a reference connection 328. The output terminal 324 of the RS flip-flop 302 is coupled to the high-side driver 112 via the output terminal 220 of the level shifter 204. The power connection 326 of the RS flip-flop 302 is coupled to the high-voltage supply VBOOT via the power connection 222 of the level shifter 204. The reference connection 328 of the RS flip-flop 302 is coupled to the bridge node 118 of the power converter 102 via the reference connection 224 of the level shifter 204.

The gate terminal of the first high-voltage transistor 304 is coupled to the first input terminal 216 of the level shifter 204 to receive the set control signal from the pulse generator 202. The drain terminal of the first high-voltage transistor 304 is coupled to the first sensing resistor 308, the source terminal of the first differential transistor 312, and the gate terminal of the second differential transistor 314. The source terminal of the first high-voltage transistor 304 is coupled to the reference terminal 110. The gate terminal of the second high-voltage transistor 306 is coupled to the second input terminal 218 of the level shifter 204 to receive the reset control signal from the pulse generator 202. The drain terminal of the second high-voltage transistor 306 is coupled to the second sensing resistor 310, the gate terminal of the first differential transistor 312, and the source terminal of the second differential transistor 314. The source terminal of the second high-voltage transistor 306 is coupled to the reference terminal 110. The first sensing resistor 308 is coupled between the high-voltage supply VBOOT and the drain terminal of the first high-voltage transistor 304. The second sensing resistor 310 is coupled between the high-voltage supply VBOOT and the drain terminal of the second high-voltage transistor 306.

The gate terminal of the first differential transistor 312 is coupled to the drain terminal of the second high-voltage transistor 306, the second sensing resistor 310, and the source terminal of the second differential transistor 314. The drain terminal of the first differential transistor 312 is coupled to the first load resistor 316 and the first input terminal 320 of the RS flip-flop 302. The source terminal of the first differential transistor 312 is coupled to the drain terminal of the first high-voltage transistor 304, the first sensing resistor 308, and the gate terminal of the second differential transistor 314. The gate terminal of the second differential transistor 314 is coupled to the drain terminal of the first high-voltage transistor 304, the first sensing resistor 308, and the source terminal of the first differential transistor 312. The drain terminal of the second differential transistor 314 is coupled to the second load resistor 318 and the second input terminal 322 of the RS flip-flop 302. The source terminal of the second differential transistor 314 is coupled to the drain terminal of the second high-voltage transistor 306, the second sensing resistor 310, and the gate terminal of the first differential transistor 312. The first load resistor 316 is coupled between the high-voltage supply VBOOT and the first input terminal 320 of the RS flip-flop 302. The second load resistor 318 is coupled between the high-voltage supply VBOOT and the second input terminal 322 of the RS flip-flop 302.

The drain terminals of the first high-voltage transistor 304 and the second high-voltage transistor 306 each have parasitic capacitances. These parasitic capacitances can generate pulse signals even when the set and reset control signals are both kept low. The first differential transistor 312 and the second differential transistor 314 act as a comparator to prevent these unwanted parasitic pulse signals from reaching the RS flip-flop 302. In particular, only differential voltages between the first sensing resistor 308 and the second sensing resistor 310 that are greater than the threshold voltages of the first differential transistor 312 or the second differential transistor 314 may pass through to the RS flip-flop 302. For example, when the first high-voltage transistor 304 and the second high-voltage transistor 306 each generate parasitic pulse signals, the differential voltage between the first sensing resistor 308 and the second sensing resistor 310 is less than the threshold voltages of the first differential transistor 312 and the second differential transistor 314. Thus, the parasitic pulse signals are not permitted to pass through to the RS flip-flop 302. However, when the set control signal changes from low to high while the reset control signal is kept low, the differential voltage between the first sensing resistor 308 and the second sensing resistor 310 is greater than the threshold voltage of the first differential transistor 312. Thus, the pulse generated on the first high-voltage transistor 304 by the set control signal is allowed to pass through the comparator and place the RS flip-flop 302 in the set state. Further, when the reset control signal changes from low to high while the set control signal is kept low, the differential voltage between the first sensing resistor 308 and the second sensing resistor 310 is greater than the threshold voltage of the second differential transistor 314. Thus, the pulse generated on the second high-voltage transistor 306 by the reset control signal is allowed to pass through the comparator and place the RS flip-flop 302 in the reset state.

Figure 4:
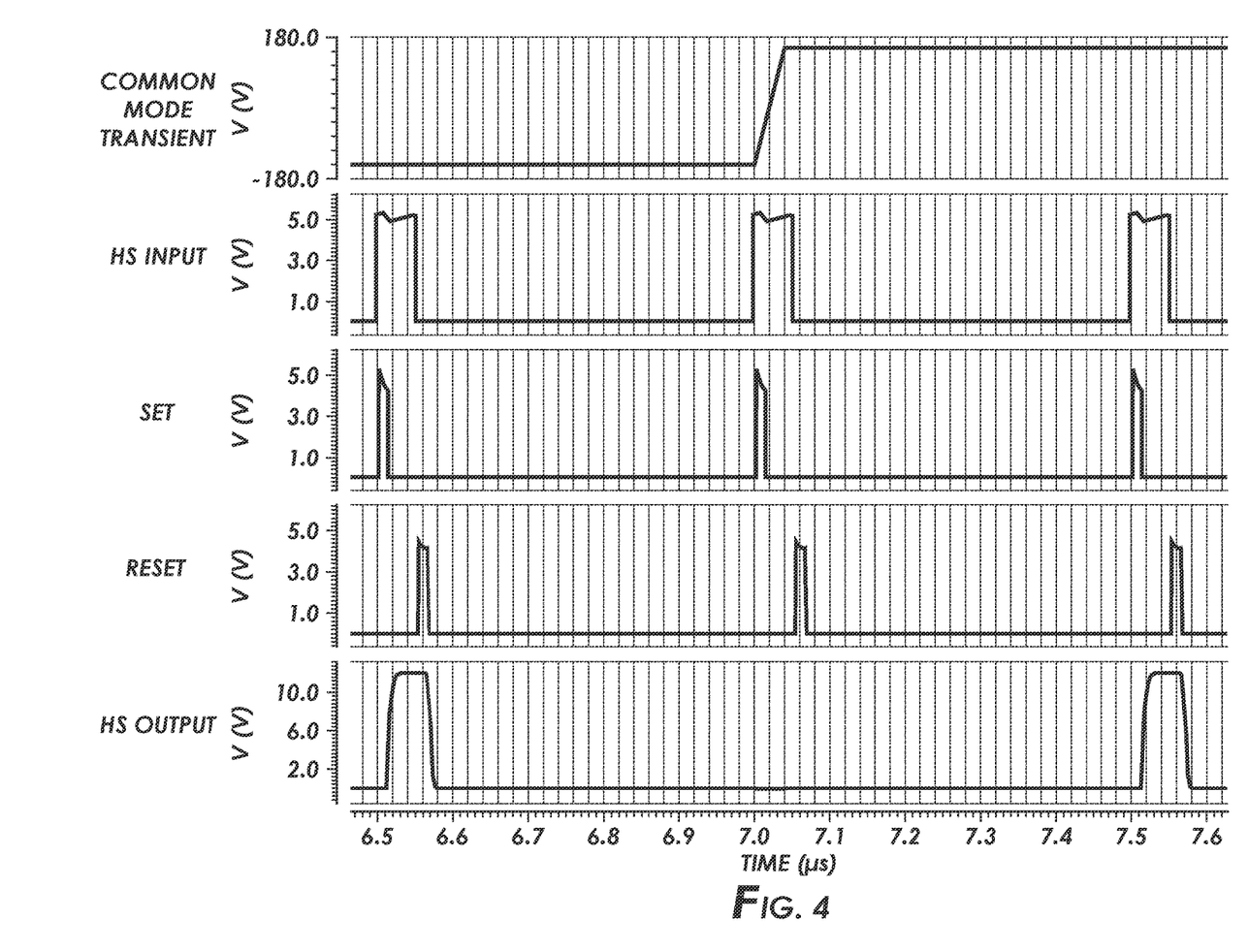
FIG. 4 shows plots of an example response of a pulse generator generating fixed-length set and reset control signals in accordance with some implementations.

While the level shifter 204 is configured to protect against parasitic pulse signals, the level shifter 204 is susceptible to common mode transients. Common mode transients can occur during zero voltage switching and zero current switching. For example, returning to FIG. 1A, while the low-side transistor 108 is turned on (and the high-side transistor 106 is turned off), current flows through the inductor 120 from the output VOUT to the low-side transistor 108. When the low-side transistor 108 is subsequently turned off, some remaining current may be present in the LC filter formed by the inductor 120 and the first capacitor 122. Due to the polarization of the inductor 120, the remaining current flows into the bridge node 118 which causes a voltage transition at the bridge node 118. This voltage transition at the bridge node 118 may apply a current to the level shifter 204 which prevents the level shifter 204 from generating a large voltage differential between the first sensing resistor 308 and the second sensing resistor 310 in response to a pulse in the set or reset control signals. Thus, common mode transients can prevent the level shifter 204 from placing the RS flip-flop 302 in the set state when the set control signal changes from low to high while the reset control signal is kept low. Similarly, common mode transients can prevent the level shifter 204 from placing the RS flip-flop 302 in the reset state when the reset control signal changes from low to high while the set control signal is kept low. In other words, common mode transients can prevent the signal converter 116 from generating pulses in the high-side output control signal in response to pulses in the high-side input control signal HS_INPUT. For example, in the response diagram of FIG. 4, the pulse widths of the second pulses in the set control signal and the reset control signal generated by the pulse generator 202 are shorter than the common mode transient (indicated by the transition in the top plot). As illustrated in FIG. 4, the signal converter 116 does not generate a pulse in the high-side output control signal in response to the pulse in the set control signal that the pulse generator 202 generates during the common mode transient.

One solution for addressing the effects of common mode transients on the level shifter 204 is to set the pulse widths of the set and reset control signals large enough to last longer than a common mode transient. For example, the pulse width of the set control signal may be set large enough such that the level shifter 204 is able to detect the pulse in the set control signal after the common mode transient is complete and place the RS flip-flop 302 in the set state. However, increasing the pulse widths of the set and reset control signals also increases the power loss of the level shifter 204. In current power converters (for example, with signal converters that do not include the controller 206 of FIG. 2), the pulse widths of the set and reset control signals are predetermined and fixed. Thus, designers of current power converters must set the pulse widths of the set and reset control signals to fixed values that compromise between acceptable power loss and reliable transmission during common mode transients.

Figure 5:
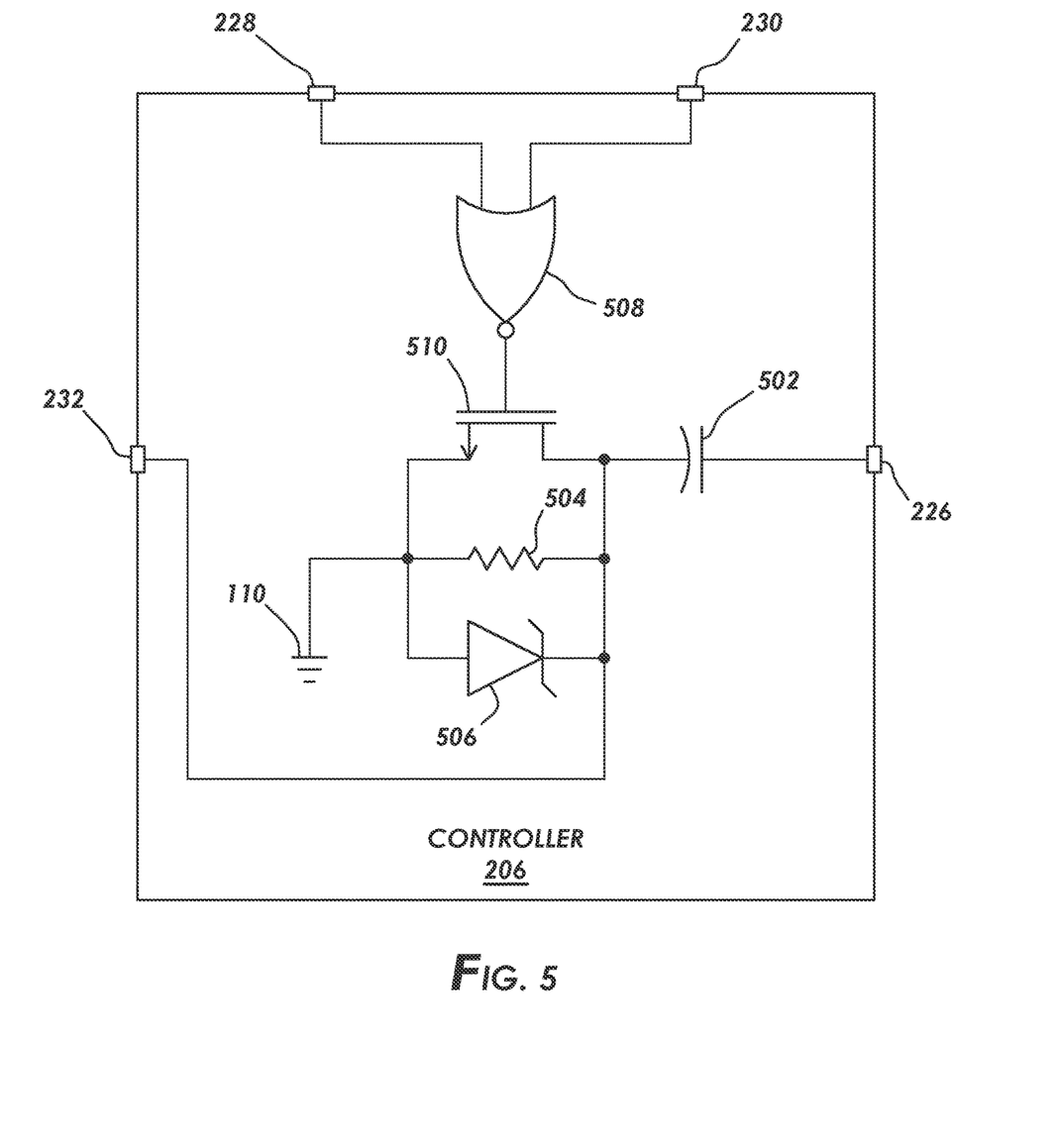
FIG. 5 is a partial schematic and partial block diagram of an example of a controller included in the signal converter of FIG. 2 in accordance with some implementations.

The controller 206 of FIG. 2 removes the need for compromising between acceptable power loss and reliable transmission during common mode transients. In particular, the controller 206 generates detection signals during common mode transients which, as will be described in more detail below, cause the pulse generator 202 to increase the pulse widths of set and reset control signals during common mode transients. FIG. 5 is a partial schematic and partial block diagram of an example of the controller 206 in accordance with some implementations of the present disclosure. The controller 206 illustrated in FIG. 5 includes a high-voltage sensing capacitor 502, a load resistor 504, a Zener diode 506, a NOR gate 508, and a transistor 510. In some implementations, the controller 206 may include more components, fewer components, or different components than the ones illustrated in FIG. 5. For example, in some implementations, the controller 206 may include or be coupled to a biasing source that applies a biasing voltage to the sensing terminal 226 of the controller 206.

The high-voltage sensing capacitor 502 is coupled to the bridge node 118 of the power converter 102 via the sensing terminal 226 of the controller 206. The high-voltage sensing capacitor 502 is also coupled to the output terminal 232 of the controller 206. Before a common mode transient is present at the bridge node 118, the sensing terminal 226 of the controller 206 is grounded and the high-voltage sensing capacitor 502 is discharged. The load resistor 504 (which may include a passive element, an active element, or both) is coupled between the reference terminal 110 and the output terminal 232 of the controller 206. When the high-voltage sensing capacitor 502 is discharged, the load resistor 504 grounds the output terminal 232 of the controller 206 to the reference terminal 110. Thus, the controller 206 does not generate a detection signal before a common mode transient is present at the bridge node 118. During a common mode transient at the bridge node 118, the high-voltage sensing capacitor 502 conducts current. While the high-voltage sensing capacitor 502 conducts current, current from the high-voltage sensing capacitor 502 flows through the load resistor 504. This current flowing through the load resistor 504 generates a voltage across the load resistor 504. The Zener diode 506 is coupled in a parallel configuration with the load resistor 504 and acts as a shunt device to maintain a constant voltage across the load resistor 504. Thus the high-voltage sensing capacitor 502 is charged via the Zener diode 506 during a common mode transient. The constant voltage across the load resistor 504 sets the voltage level at the output terminal 232 of the controller 206 to a voltage level that is greater than the voltage level at the reference terminal 110. Thus, the controller 206 generates a detection signal during a common mode transient at the bridge node 118. After a common mode transient at the bridge node 118, the high-voltage sensing capacitor 502 stops conducting. When the high-voltage sensing capacitor 502 stops conducting, current flowing through the load resistor 504 charges the high-voltage sensing capacitor 502 and the voltage level at the output terminal 232 of the controller 206 is set back to the voltage level at the reference terminal 110. Thus, the controller 206 stops generating a detection signal after a common mode transient at the bridge node 118.

The NOR gate 508 and the transistor 510 are configured to reset the voltage level at the output terminal 232 of the controller 206 when the set and reset control signals are both set low. The inputs of the NOR gate 508 are coupled to the first input terminal 228 and the second input terminal 230 of the controller 206 to receive the set and reset control signals generated by the pulse generator 202. The output of the NOR gate 508 is coupled to the gate terminal of the transistor 510. The transistor 510 is coupled between the reference terminal 110 and the output terminal 232 of the controller 206. When either of the set or reset control signals are set high, the output of the NOR gate 508 is set low and the transistor 510 is turned off. When the transistor 510 is turned off, the controller 206 generates detection signals during common mode transients, as described above. Alternatively, when the set and reset control signals are both set low, the output of the NOR gate 508 is set high and the transistor 510 is turned on to keep the voltage level at the output terminal 232 of the controller 206 at the voltage level at the reference terminal 110. Thus, the NOR gate 508 and the transistor 510 prevent the controller 206 from generating detection signals when the set and reset control signals are both set low.

Figure 6:
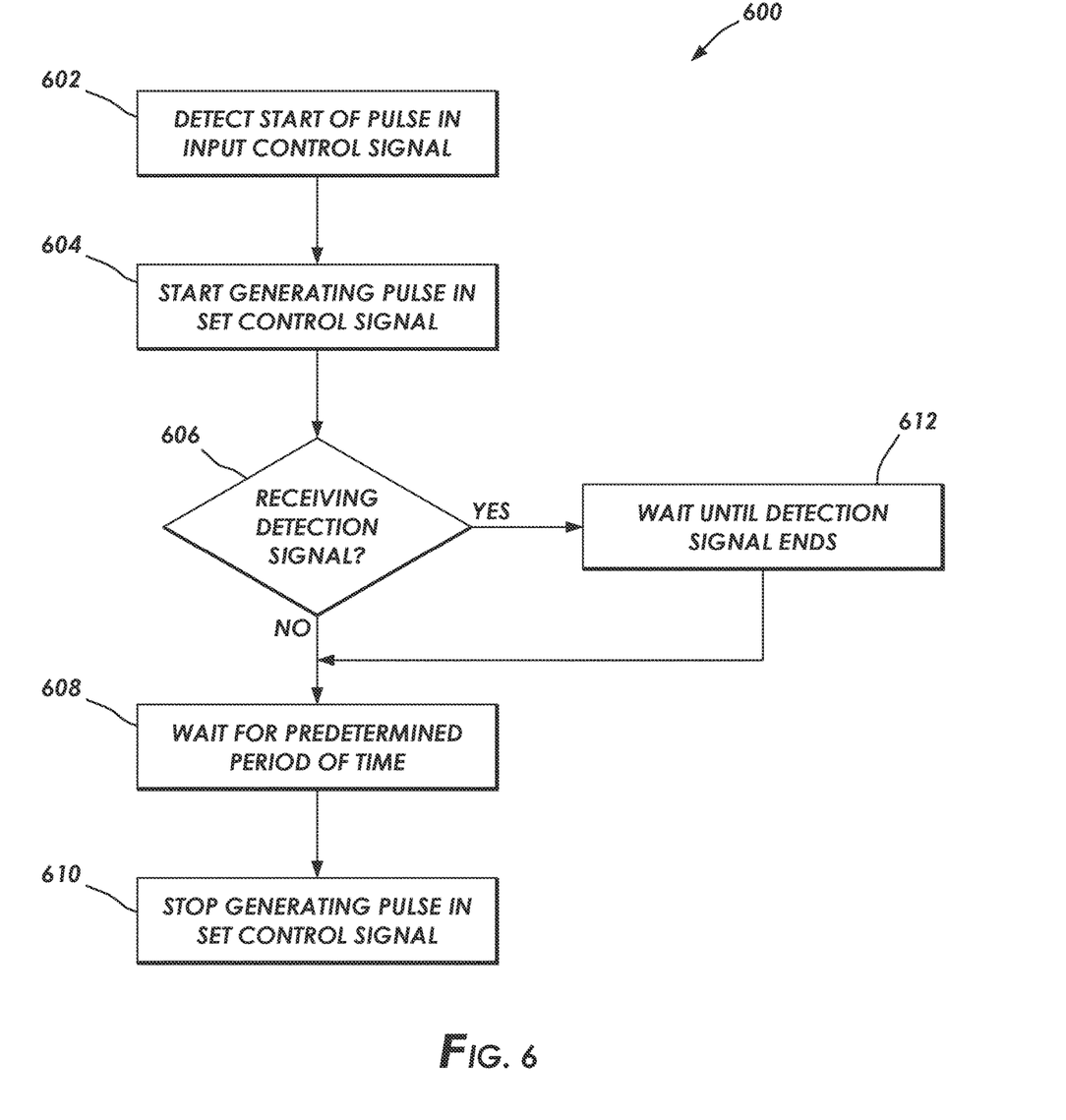
FIG. 6 is a flow diagram of an example of a method for generating a pulse in a set control signal in accordance with some implementations.

The pulse generator 202 provides reliable transmission of pulses in the set control signal during common mode transients by generating longer pulses in the set control signal during common mode transients. Further, the pulse generator 202 reduces overall power loss by generating shorter pulses in the set control signal when a common mode transient is not occurring. FIG. 6 is a flow diagram of an example of a method 600 for generating a pulse in the set control signal in accordance with some implementations. For simplicity of explanation, the method 600 is described as a series of operations performed by the pulse generator 202. However, the operations in accordance with the method 600 may be performed by different components. At block 602, the pulse generator 202 detects a start of a pulse in the input control signal. For example, the pulse generator 202 may detect a rising-edge in the high-side input control signal HS_INPUT. At block 604, the pulse generator 202 starts generating a pulse in the set control signal. For example, in the response diagram of FIG. 7, the set control signal changes from low to high after the high-side input control signal HS_INPUT changes from low to high.

Figure 7:
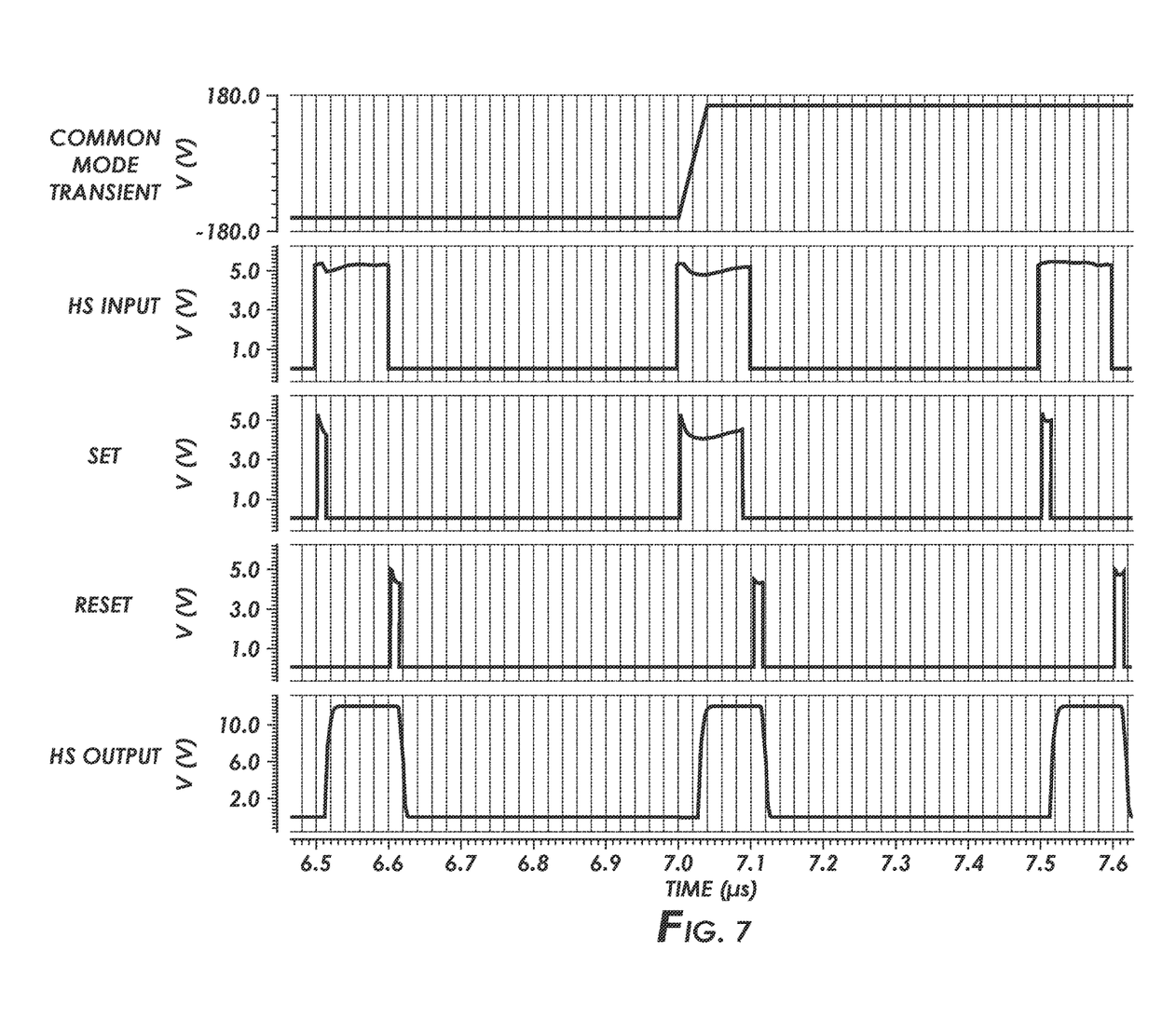
FIG. 7 shows plots of an example response of a pulse generator generating a set control signal with an increased pulse width during a common mode transient in accordance with some implementations.

Returning to block 606 in FIG. 6, the pulse generator 202 determines whether the detection signal is being received. When the pulse generator 202 is not receiving the detection signal, the pulse generator 202 waits for a predetermined period of time at block 608. For example, the pulse generator 202 may wait for approximately 20 nanoseconds. After the predetermined period of time, the pulse generator 202 stops generating the pulse in the set control signal at block 610. For example, in FIG. 7, there is no common mode transient during the first pulse in the high-side input control signal HS_INPUT. Thus, as illustrated in FIG. 7, the first pulse in the set control signal lasts for a predetermined period of about 20 nanoseconds.

Returning again to block 606 in FIG. 6, when the pulse generator 202 receives the detection signal while generating the pulse in the set control signal, the pulse generator 202 waits until the detection signal ends at block 612. Next, the pulse generator 202 waits for the predetermined period of time at block 608, and then stops generating the pulse in the set control signal at block 610. For example, in FIG. 7, there is a common mode transient during the second pulse in the high-side input control signal HS_INPUT (as indicated by the transition in the top plot). Thus, as illustrated in FIG. 7, the second pulse in the set control signal lasts for about 20 nanoseconds following the end of the common mode transient.

Figure 8:
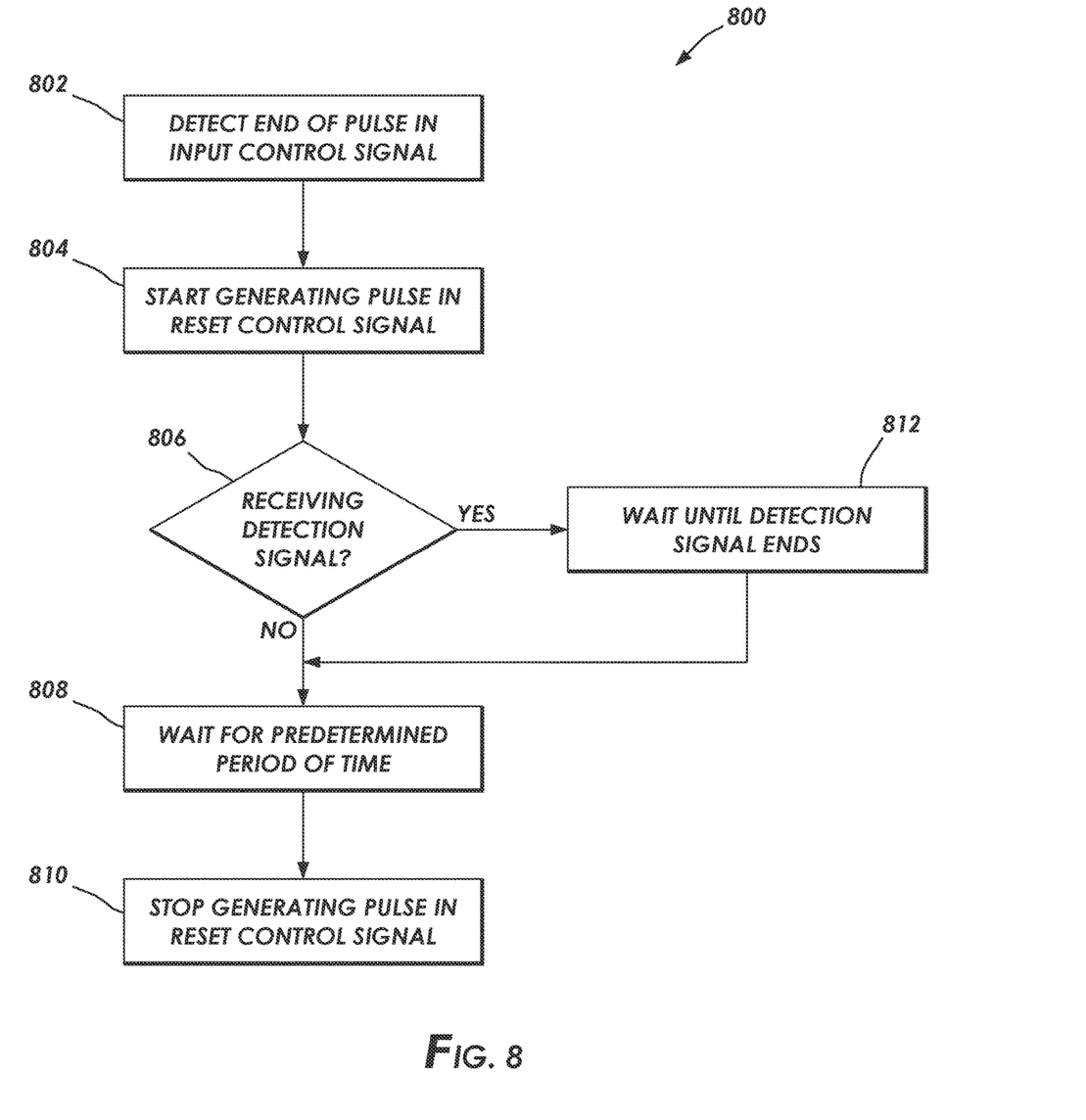
FIG. 8 is a flow diagram of an example of a method for generating a pulse in a reset control signal in accordance with some implementations.

The pulse generator 202 provides reliable transmission of pulses in the reset control signal during common mode transients by generating longer pulses in the reset control signal during common mode transients. Further, the pulse generator 202 reduces overall power loss by generating shorter pulses in the reset control signal when a common mode transient is not occurring. FIG. 8 is a flow diagram of an example of a method 800 for generating a pulse in the reset control signal in accordance with some implementations. For simplicity of explanation, the method 800 is described as a series of operations performed by the pulse generator 202. However, the operations in accordance with the method 800 may be performed by different components. At block 802, the pulse generator 202 detects an end of a pulse in the input control signal. For example, the pulse generator 202 may detect a falling-edge in the high-side input control signal HS_INPUT. At block 804, the pulse generator 202 starts generating a pulse in the reset control signal. For example, in the response diagram of FIG. 9, the reset control signal changes from low to high after the high-side input control signal HS_INPUT changes from high to low.

Figure 9:
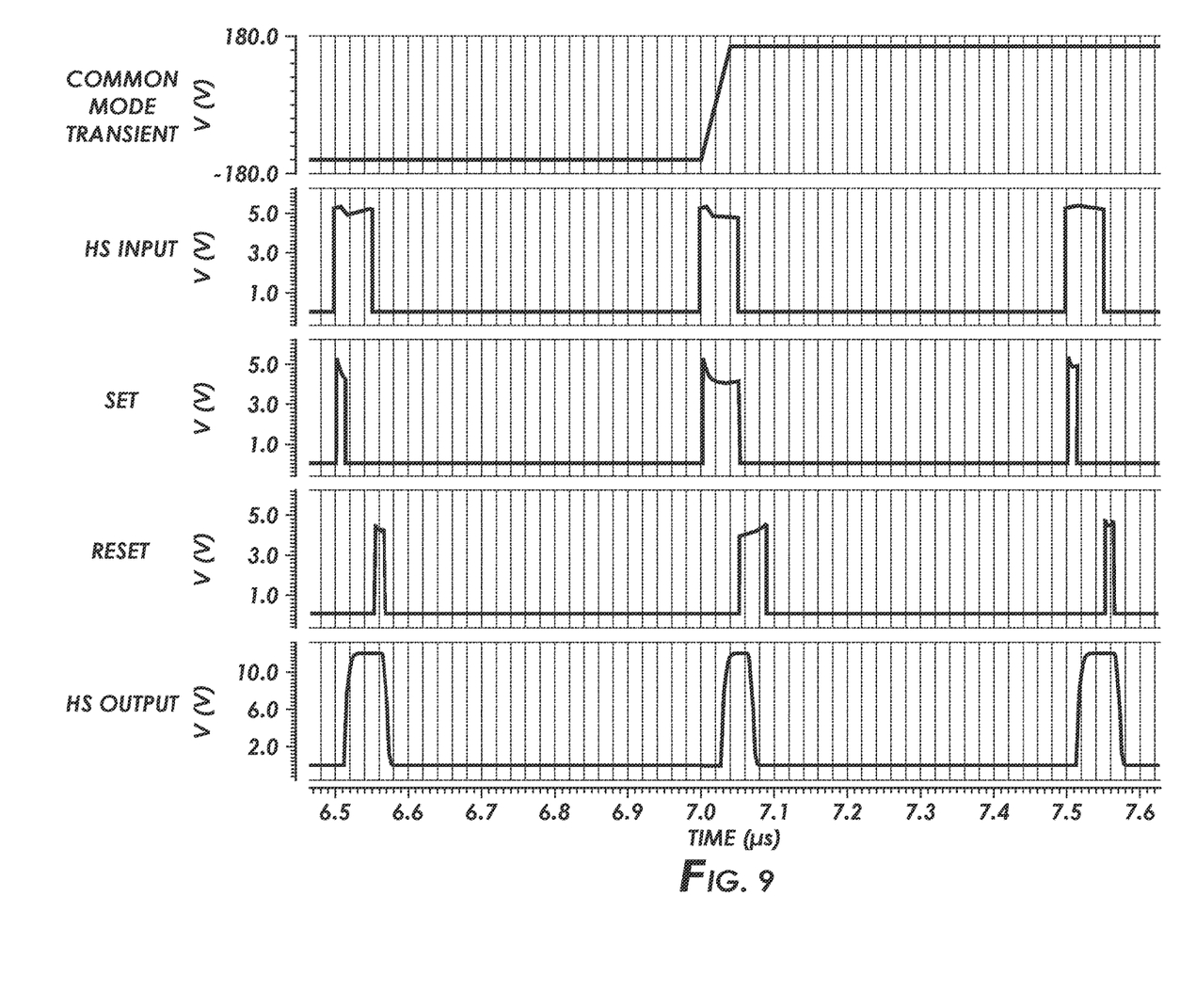
FIG. 9 shows plots of an example response of a pulse generator generating set and reset control signals with increased pulse widths during a common mode transient in accordance with some implementations.

Returning to block 806 in FIG. 8, the pulse generator 202 determines whether the detection signal is being received. When the pulse generator 202 is not receiving the detection signal, the pulse generator 202 waits for a predetermined period of time at block 808. For example, the pulse generator 202 may wait for approximately 20 nanoseconds. After the predetermined period of time, the pulse generator 202 stops generating the pulse in the reset control signal at block 810. For example, in FIG. 9, there is no common mode transient during the first pulse in the high-side input control signal HS_INPUT. Thus, as illustrated in FIG. 9, the first pulse in the reset control signal lasts for a predetermined period of about 20 nanoseconds.

Returning again to block 806 in FIG. 8, when the pulse generator 202 receives the detection signal while generating the pulse in the reset control signal, the pulse generator 202 waits until the detection signal ends at block 812. Next, the pulse generator 202 waits for the predetermined period of time at block 808, and then stops generating the pulse in the reset control signal at block 810. For example, in FIG. 9, there is a common mode transient during the second pulse in the high-side input control signal HS_INPUT (as indicated by the transition in the top plot). Thus, as illustrated in FIG. 9, the second pulse in the reset control signal lasts for about 20 nanoseconds following the end of the common mode transient.

Overlapping pulses in the set and reset control signals may cause undesired operation. For example, overlapping pulses in the set and reset control signals may cause the RS flip-flop 302 in the level shifter 204 to go into an unstable state. To avoid this, the pulse generator 202 may only generate a pulse in either the set or reset control signal at any given time. As described above, the pulse generator 202 is configured to start generating a pulse in the reset signal after the end of a pulse in the high-side input control signal HS_INPUT. To avoid overlapping pulses, the pulse generator 202 is configured to stop generating a pulse in the set control signal after the end of a pulse in the high-side input control signal HS_INPUT. In some situations, the pulse generator 202 may stop generating a pulse in the set control signal during a common mode transient or during the predetermined period of time following the end of a common mode transient. For example, in FIG. 9, the second pulse in the high-side input control signal HS_INPUT ends before the end of the common mode transient. Thus, as illustrated in FIG. 9, the second pulse in the set control signal ends before the common mode transient ends.

Figure 10:
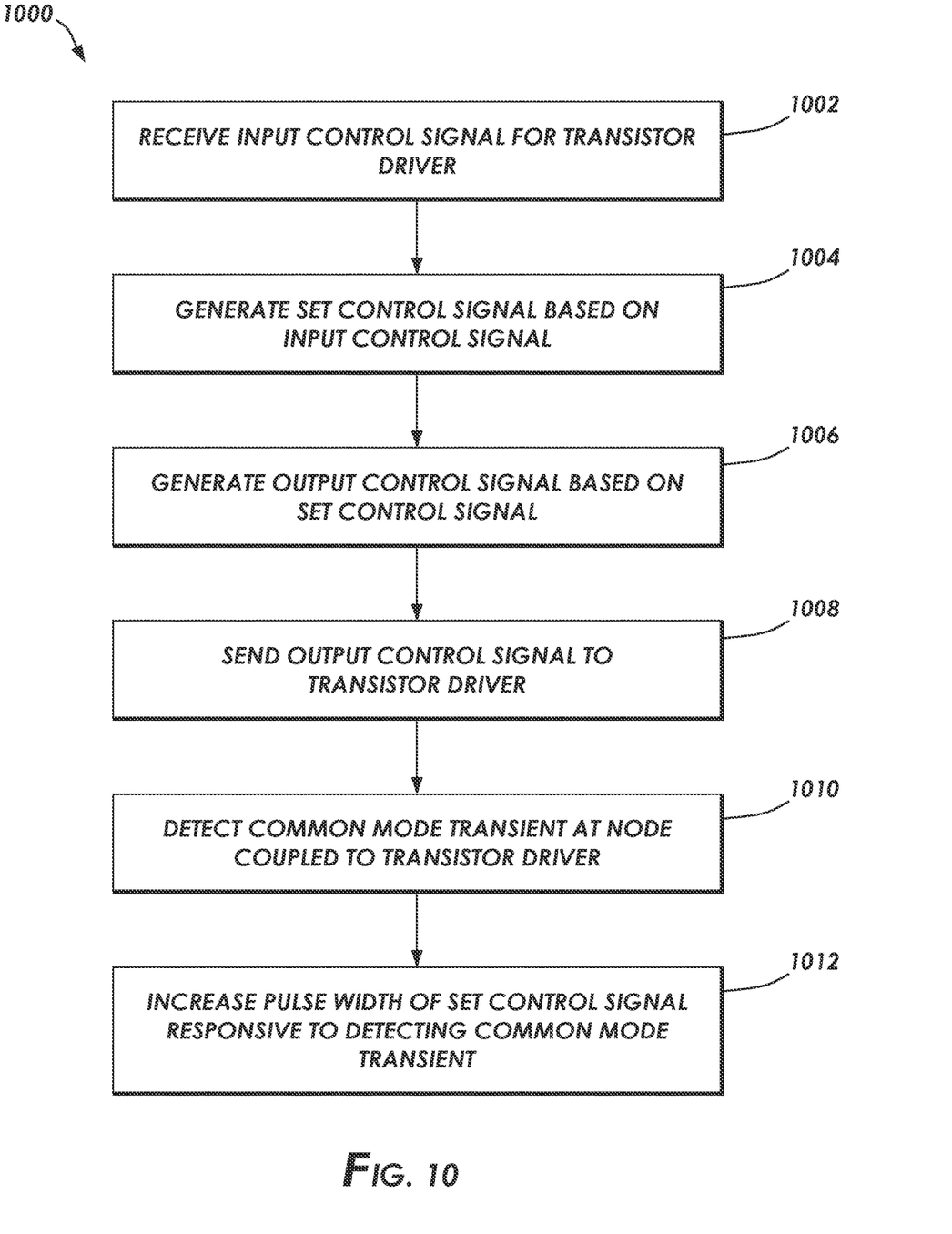
FIG. 10 is a flow diagram of an example of a method for adaptive pulse control in accordance with some implementations.

FIG. 10 is a flow diagram of an example of a method 1000 for adaptive pulse control in accordance with some implementations. For simplicity of explanation, the method 1000 is described as a series of operations performed by different components of the signal converter 116. However, the operations in accordance with the method 1000 may be performed by other components. At block 1002, an input control signal for a transistor driver is received. For example, the pulse generator 202 may receive the high-side input control signal HS_INPUT for the high-side driver 112 of FIG. 1A. Further, the pulse generator 202 may receive the input control signal INPUT for the floating driver 138 of FIG. 1B. At block 1004, a set control signal is generated based on the input control signal. For example, the pulse generator 202 may generate a pulse in a set control signal when the pulse generator 202 detects a rising-edge of the high-side input control signal HS_INPUT. At block 1006, an output control signal is generated based on the set control signal. For example, the level shifter 204 may generate a pulse in the high-side output control signal when the level shifter 204 detects a pulse in the set control signal. At block 1008, the output control signal is sent to the transistor driver. For example, the level shifter 204 may send the high-side output control signal to the high-side driver 112 of FIG. 1A. Further, the level shifter 204 may send an output control signal to the floating driver 138 of FIG. 1B. At block 1010, a common mode transient is detected at a node coupled to the transistor driver. For example, the controller 206 may detect a common mode transient at the bridge node 118 or at the high-voltage supply VBOOT. At block 1012, the pulse width of the set control signal is increased responsive to detecting the common mode transient. For example, the pulse generator 202 may increase the pulse width of a pulse in the set control signal when the controller 206 detects a common mode transient at the bridge node 118 of the power converter 102. In some implementations, the pulse generator 202 may also increase the pulse width of a pulse in the reset control signal when the controller 206 detects a common mode transient, for example, at the bridge node 118 of the power converter 102.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. A signal converter, comprising:
a pulse generator configured to:
receive an input control signal for a switch driver, and
generate a set control signal based on the input control signal;
a level shifter configured to:
generate, based on the set control signal, an output control signal having a first amplitude greater than a second amplitude of the input control signal, and
send the output control signal to the switch driver; and
a controller configured to detect a common mode transient at a node coupled to the switch driver,
wherein the pulse generator is further configured to increase a pulse width of the set control signal when the controller detects the common mode transient.

2. The signal converter of claim 1, wherein the pulse generator is further configured to generate a reset control signal based on the input control signal, and wherein the level shifter is further configured to generate the output control signal based on the set control signal and the reset control signal.

3. The signal converter of claim 2, wherein the pulse width is a first pulse width, and wherein the pulse generator is further configured to increase a second pulse width of the reset control signal when the controller detects the common mode transient.

4. The signal converter of claim 1, wherein, to increase the pulse width of the set control signal when the controller detects the common mode transient, the pulse generator is further configured to stop generating a set pulse in the set control signal after a predetermined period of time following an end of the common mode transient.

5. The signal converter of claim 4, wherein, to generate the set control signal based on the input control signal, the pulse generator is further configured to:
start generating the set pulse in the set control signal responsive to detecting a start of an input pulse in the input control signal, and
stop generating the set pulse in the set control signal responsive to detecting an end of the input pulse in the input control signal before the end of the common mode transient.

6. The signal converter of claim 1, wherein the switch driver is a high-side driver of a half-bridge driver.

7. The signal converter of claim 1, wherein the switch driver is a floating driver.

8. A system for power conversion, comprising:
a power converter including a transistor;
a driver configured to control the transistor; and
a signal converter configured to:
receive an input control signal for the driver,
generate a set control signal based on the input control signal,
generate, based on the set control signal, an output control signal having a first voltage level greater than a second voltage level of the input control signal,
send the output control signal to the driver,
detect a common mode transient at a node coupled to the driver, and
increase a pulse width of the set control signal responsive to detecting the common mode transient.

9. The system of claim 8, wherein the transistor is a high-side transistor, wherein the power converter further includes a low-side transistor, wherein the driver is a high-side driver, and wherein the system further includes a low-side driver configured to control the low-side transistor.

10. The system of claim 9, wherein the node coupled to the high-side driver is a bridge node coupled between the high-side transistor and the low-side transistor.

11. The system of claim 8, wherein the driver is a floating driver, and wherein the power converter further includes a diode having:
a cathode coupled to the transistor, and
an anode coupled to a reference terminal.

12. The system of claim 8, wherein the signal converter is further configured to:
generate a reset control signal based on the input control signal, and
generate the output control signal based on the set control signal and the reset control signal.

13. The system of claim 12, wherein the pulse width is a first pulse width, and wherein the signal converter is further configured to increase a second pulse width of the reset control signal responsive to detecting the common mode transient.

14. The system of claim 8, wherein, to increase the pulse width of the set control signal responsive to detecting the common mode transient, the signal converter is further configured to stop generating a set pulse in the set control signal after a predetermined period of time following an end of the common mode transient.

15. The system of claim 14, wherein, to generate the set control signal based on the input control signal, the signal converter is further configured to:
start generating the set pulse in the set control signal responsive to detecting a start of an input pulse in the input control signal, and
stop generating the set pulse in the set control signal responsive to detecting an end of the input pulse in the input control signal before the end of the common mode transient.

16. A method for adaptive pulse control, the method comprising:
receiving an input control signal for a transistor driver;
generating a set control signal based on the input control signal;
generating, based on the set control signal, an output control signal having a first amplitude greater than a second amplitude of the input control signal;
sending the output control signal to the transistor driver;
detecting a common mode transient at a node coupled to the transistor driver; and
increasing a pulse width of the set control signal responsive to detecting the common mode transient.

17. The method of claim 16, further comprising:
generating a reset control signal based on the input control signal; and
generating the output control signal based on the set control signal and the reset control signal.

18. The method of claim 17, wherein the pulse width is a first pulse width, and wherein the method further comprises increasing a second pulse width of the reset control signal responsive to detecting the common mode transient.

19. The method of claim 16, wherein increasing the pulse width of the set control signal responsive to detecting the common mode transient further includes stopping generating a set pulse in the set control signal after a predetermined period of time following an end of the common mode transient.

20. The method of claim 19, wherein generating the set control signal based on the input control signal further includes:

detecting a start of an input pulse in the input control signal, starting to generate the set pulse in the set control signal responsive to detecting the start of the input pulse in the input control signal, detecting an end of the input pulse in the input control signal, and stopping generating the set pulse in the set control signal responsive to detecting the end of the input pulse in the input control signal before the end of the common mode transient.

\* \* \* \* \*